(12) United States Patent
Veschetti et al.

(10) Patent No.: US 7,972,894 B2
(45) Date of Patent: Jul. 5, 2011

(54) METHOD OF PRODUCING A PHOTOVOLTAIC CELL WITH A HETEROJUNCTION ON THE REAR FACE

(75) Inventors: Yannick Veschetti, Saint Clair la Tour (FR); Bruno Remiat, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 293 days.

(21) Appl. No.: 12/442,853

(22) PCT Filed: Sep. 21, 2007

(86) PCT No.: PCT/EP2007/060016
§ 371 (c)(1),
(2), (4) Date: Mar. 25, 2009

(87) PCT Pub. No.: WO2008/037658
PCT Pub. Date: Apr. 3, 2008

(65) Prior Publication Data
US 2010/0087031 A1   Apr. 8, 2010

(30) Foreign Application Priority Data
Sep. 26, 2006   (FR) ..................... 06 53943

(51) Int. Cl.
*H01L 21/00* (2006.01)
(52) U.S. Cl. .......................... 438/98; 438/72
(58) Field of Classification Search ........... 438/98
See application file for complete search history.

(56) References Cited

U.S. PATENT DOCUMENTS

| | | | |
|---|---|---|---|
| 4,927,770 A | 5/1990 | Swanson | |
| 5,053,083 A | 10/1991 | Sinton | |
| 5,134,090 A | 7/1992 | Bean et al. | |
| 5,213,628 A | 5/1993 | Noguchi et al. | |
| 6,500,731 B1 | 12/2002 | Nakagawa et al. | |
| 7,670,937 B2 * | 3/2010 | Veschetti et al. | 438/548 |
| 2004/0261839 A1 * | 12/2004 | Gee et al. | 136/256 |
| 2008/0061293 A1 | 3/2008 | Ribeyron et al. | |
| 2009/0101190 A1 * | 4/2009 | Salami et al. | 136/244 |
| 2010/0029039 A1 * | 2/2010 | Shan et al. | 438/98 |
| 2011/0041911 A1 * | 2/2011 | Lee et al. | 136/256 |

FOREIGN PATENT DOCUMENTS

FR  2 880 989  7/2006
WO  WO 03/083955 A1  10/2003

OTHER PUBLICATIONS

M. Estrada, et al., "Influence of Low-Temperature Annealing on the Dielectric Characteristics and Final Parameters of $SiO_2$ MIS Thin Film Transistors", Elsevier, Thin Solid Films, 298, 1997, pp. 241-244.

* cited by examiner

*Primary Examiner* — N Drew Richards
*Assistant Examiner* — Grant S Withers
(74) *Attorney, Agent, or Firm* — Oblon, Spivak, McClelland, Maier & Neustadt, L.L.P.

(57) ABSTRACT

A method of producing a photovoltaic cell. A passivation layer based on an intrinsic amorphous semiconductor is deposited on a back surface of a substrate based on a crystalline semiconductor. A first sacrificial mask including at least one through-opening on the passivation layer is screen-printed at a temperature less than or equal to 250° C. A doped amorphous semiconductor layer of a first type of conductivity is deposited at least in the opening. The first sacrificial mask is removed, leaving at least one doped amorphous semiconductor pad of the first type of conductivity remaining at the opening of the first sacrificial mask.

15 Claims, 9 Drawing Sheets

METHOD OF PRODUCING A PHOTOVOLTAIC CELL WITH A HETEROJUNCTION ON THE REAR FACE

TECHNICAL FIELD AND PRIOR ART

The invention relates to the production of photovoltaic cells, and particularly cells with contacts and a heterojunction of the back-surface amorphous/crystalline type.

Two types of photovoltaic structures currently enable obtainment of conversion efficiencies greater than 21% during laboratory tests, and close to 20% during industrial production.

The first structure, commonly called HIT (Heterojunction with Intrinsic Thin Layers), comprises a heterojunction formed by depositing thin layers of amorphous silicon onto a crystalline silicon base. This structure, which is produced entirely at a low temperature, i.e., at temperatures of less than or equal to approximately 200° C., makes it possible to obtain good surface passivations and to reach high open circuit voltages in comparison with conventional photovoltaic cell production methods, wherein the temperature reached during the implementation thereof is approximately 850° C. The document U.S. Pat. No. 5,213,628 describes such a structure.

The second structure comprises a junction and a set of contacts on a surface which is opposite the front surface of the photovoltaic cell, referred to as the back surface, i.e., the surface intended to receive light radiation. This structure is commonly called RCC (Rear Contact Cell) or IBC (Interdigitated Back Contact). It enables high current densities to be reached owing to the absence of contacts on the front surface. The documents WO 03/083955 and FR 2 880 989 describe this type of structure.

DISCLOSURE OF THE INVENTION

One purpose of this invention is to propose a method of producing a back-surface heterojunction photovoltaic cell which is industrially viable and which improves the performance of the cells manufactured.

To accomplish this, this invention proposes a method of producing a photovoltaic cell, comprising at least the steps of:

a) deposition of a passivation layer based on at least one intrinsic amorphous semiconductor on a back surface of a substrate based on at least one crystalline semiconductor, b) screen-printing of a first sacrificial mask comprising at least one through-opening on the passivation layer, c) deposition of a doped amorphous semiconductor layer of a first type of conductivity at least in the opening, d) removal of the first sacrificial mask, leaving at least one doped amorphous semiconductor pad of the first type of conductivity remaining at the opening of the first sacrificial mask.

The step b) of producing the first etching mask may be implemented at a temperature of less than or equal to approximately 250° C., or less than or equal to approximately 200° C.

The techniques used in this method enable the photovoltaic cell to be exposed only to temperatures substantially less than or equal to approximately 250° C. or 200° C. during production of the back surface of the cell, which would not be possible, for example, with a back-surface passivation layer based on silicon nitride.

Furthermore, the use of an intrinsic amorphous semiconductor on the back surface of the substrate makes it possible to obtain an excellent passivation of the back surface of this substrate.

Contrary to a standard method for depositing a sacrificial layer, e.g., based on a semiconductor oxide, which is generally carried out at a high temperature, e.g., 1000° C., the production of an etching mask via screen printing at a temperature of less than 250° C. or 200° C., makes it possible to not damage the passivation layer onto which the etching mask is deposited and to improve the performance of the cell thus produced.

This invention likewise relates to a method of producing a photovoltaic cell, comprising at least the steps of:

a) deposition of a passivation layer based on at least one intrinsic amorphous semiconductor on a back surface of a substrate based on at least one crystalline semiconductor, b) screen-printing a first sacrificial mask on the passivation layer, c) deposition of a doped amorphous semiconductor layer of a first type of conductivity into at least one pattern formed by the first etching mask, d) removal of the first sacrificial mask.

After step d), the method may further comprise at least the steps of:

e) screen-printing of a second sacrificial mask, the second sacrificial mask overlapping at least the doped amorphous semiconductor of the first type of conductivity, f) deposition of a doped amorphous semiconductor of a second type of conductivity, which is opposite the first type of conductivity, into at least one patter formed by the second sacrificial mask, g) removal of the second sacrificial mask, leaving at least one doped amorphous semiconductor pad of the second type of conductivity remaining at the level of the second sacrificial mask pattern.

The back-surface doped amorphous silicon regions form the heterojunction of the photovoltaic cell. Owing to the use of screen printing, the heterojunction is produced with high precision (+/−20 µm) in comparison with the conventional PECVD or catalytic CVD deposition techniques through metallic masks, the precision attained with these techniques being of the order of +/−500 µm. Furthermore, during PECVD deposition for producing the heterojunction of a photovoltaic cell, the properties of the plasma are likely to be modified based on the number of deposits made on the masks in order to form the heterojunction.

The use of sacrificial masks enables obtainment of an industrially viable method, contrary to the methods of the prior art using layers of the photovoltaic cell to likewise serve as etching masks, these layers possibly being damaged during the etching steps.

Finally, this method enables obtainment of photovoltaic cells having a high conversion efficiency, e.g., greater than 22%.

Prior to the step a) of depositing the passivation layer, the method may comprise a step of depositing a layer based on at least one amorphous semiconductor onto a front surface of the substrate, which is opposite the back surface of the substrate.

The amorphous semiconductor of the layer deposited on the front surface side of the substrate may be intrinsic or doped and of the same or opposite type of conductivity as the conductivity type of the substrate.

It is thus possible to produce a front surface field, thereby reducing recombination at this surface, when the type of doping is opposite that of the substrate, or a floating junction when the doping is similar to that of the substrate.

After the step of depositing the amorphous semiconductor-based layer onto the front surface of the substrate, the method may comprise a step of depositing an anti-reflective layer onto said amorphous semiconductor-based layer.

The step b) of producing the first sacrificial mask may include the steps of:
- deposition of a first sacrificial layer based on silicon oxide, and/or silicon carbide and/or silicon nitride onto the passivation layer,
- deposition via screen printing of a first etching mask in a pattern similar to the pattern of the first sacrificial mask,
- removal via etching of the portions of the first sacrificial layer not covered by the first etching mask, the remaining portions of the first sacrificial layer thus forming the first sacrificial mask,
- removal of the first etching mask.

In one alternative, the step b) of producing the first sacrificial mask may include the steps of:
- deposition of a first sacrificial layer based on silicon oxide, and/or silicon carbide and/or silicon nitride onto the passivation layer,
- deposition via screen printing of an etching paste, in a reverse pattern of the pattern of the first sacrificial mask, thereby forming the first sacrificial mask in the first sacrificial layer.

According to another alternative, the step b) of producing the first sacrificial mask may include deposition via screen printing of a paste based on a polymer and/or an oxide, thereby forming the first sacrificial mask.

The step e) of producing the second sacrificial mask may include the steps of:
- deposition of a second sacrificial layer based on silicon oxide, and/or silicon carbide and/or silicon nitride onto the passivation layer,
- deposition via screen printing of a second etching mask in a pattern similar to the pattern of the second sacrificial mask,
- removal via etching of the portions of the second sacrificial layer not covered by the second etching mask, the remaining portions of the second sacrificial layer thus forming the second sacrificial mask,
- removal of the second etching mask.

In one alternative, the step e) of producing the second sacrificial mask may include the steps of:
- deposition of a second sacrificial layer based on silicon oxide, and/or silicon carbide and/or silicon nitride onto the passivation layer,
- deposition via screen printing of an etching paste, in a reverse pattern of the pattern of the second sacrificial mask, thereby forming the second sacrificial mask in the second sacrificial layer.

According to another alternative, the step e) of producing the second sacrificial mask may include deposition via screen printing of a paste based on a polymer and/or an oxide, thereby forming the second sacrificial mask.

Prior to the step d) of removing the first sacrificial mask, the method may comprise a step of depositing metallizations.

Prior to the step g) of removing the second sacrificial mask, the method may include a step of depositing metallizations.

In another alternative, after the step g) of removing the second sacrificial mask, the method may comprise a step of depositing metallizations onto the doped amorphous semiconductor of the first type of conductivity and onto the doped amorphous semiconductor of the second type of conductivity via evaporation and/or spraying through a metallic mask.

When the metallizations are produced via evaporation or spraying through a metallic mask, the deposition accuracies are higher than the accuracies obtained via a plasma-enhanced deposition. Thus, the metallizations can cover a maximum surface area on the doped amorphous semiconductor, thereby optimizing the optical confinement of the light rays entering the photovoltaic cell. Furthermore, the use of the evaporation and spraying techniques makes it possible to obtain metallizations having a low contact resistance between themselves and the doped amorphous semiconductor.

Finally, prior to the step or steps of depositing metallizations, the method may further comprise a step of spray-depositing a conductive transparent oxide onto the doped amorphous semiconductor, the metallizations next being deposited onto the conductive transparent oxide.

BRIEF DESCRIPTION OF THE DRAWINGS

This invention will be better understood upon reading the description of exemplary embodiments, given for purely illustrative and non-limiting purposes, while referring to the appended drawings, in which.

Identical, similar or equivalent portions of the various figures described hereinbelow bear the same numerical references so as to facilitate moving from one figure to the other.

The various portions shown in the figures are not necessarily at a uniform scale, in order to render the figures more legible.

The various possibilities (alternatives and embodiments) should be understood as being mutually non-exclusive and capable of being combined with one another.

DETAILED DISCLOSURE OF PARTICULAR EMBODIMENTS

Figure 1A:
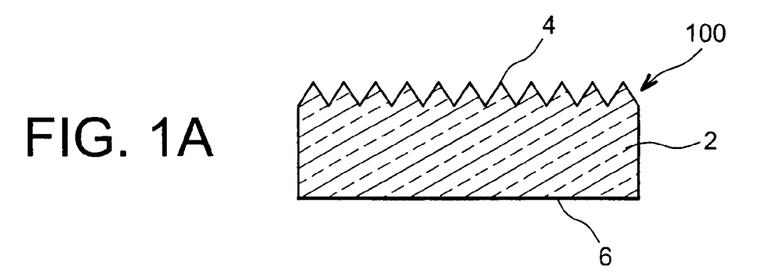
FIGS. 1A to 1R show the steps of a method of producing a photovoltaic cell, according to a first embodiment of the invention.
Figure 1B:
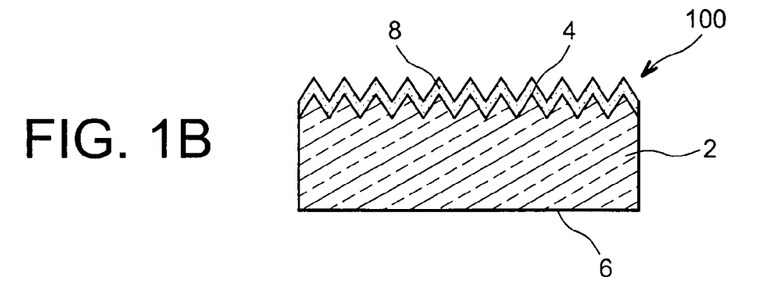
Figure 1C:
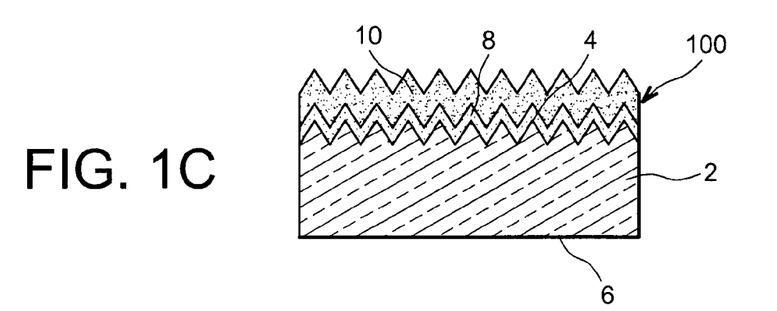
Figure 1D:
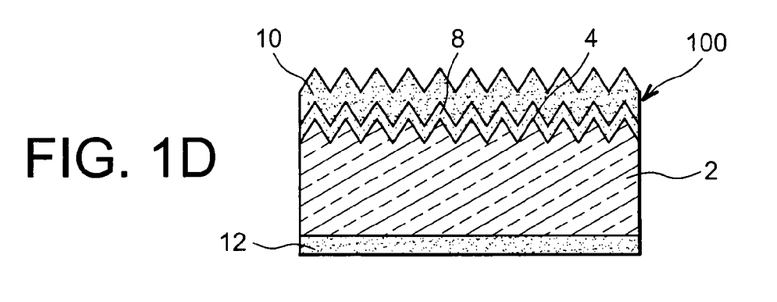
Figure 1E:
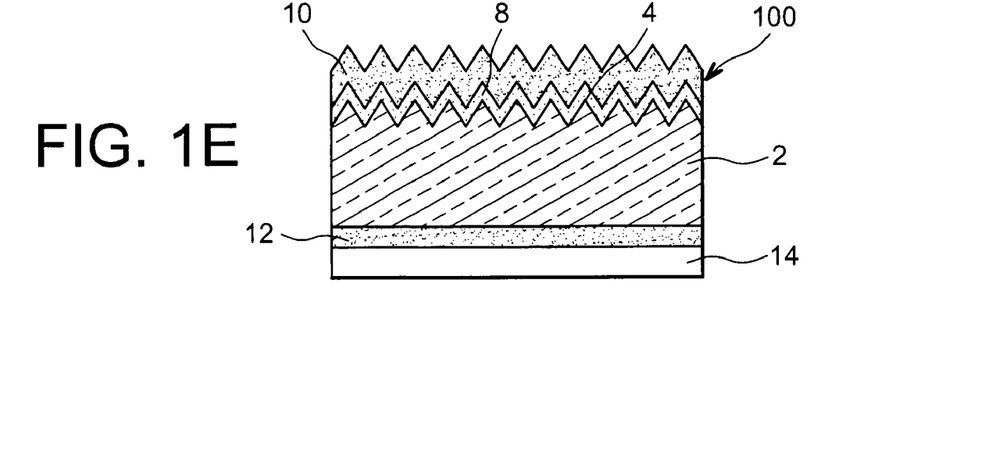
Figure 1F:
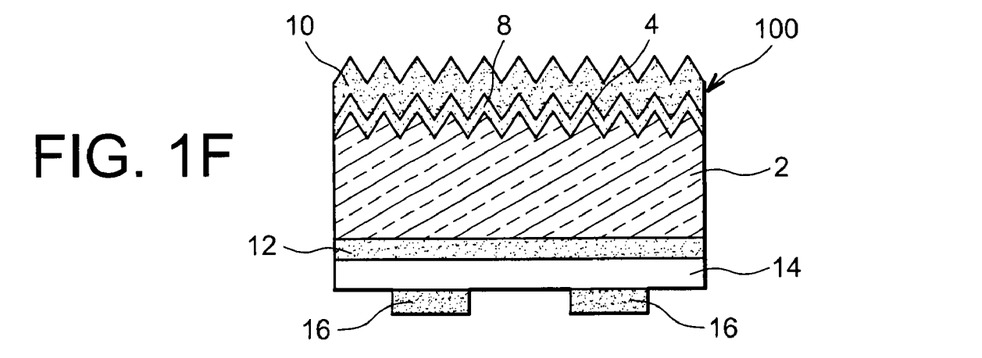
Figure 1G:
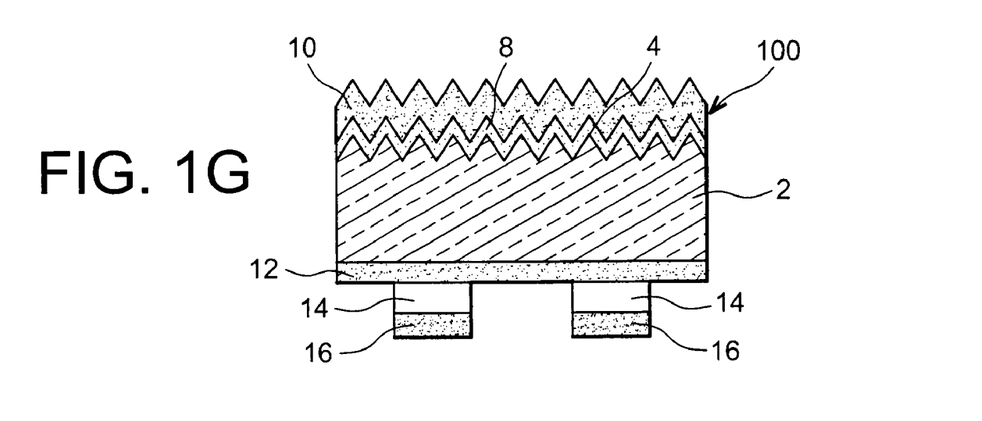
Figure 1H:
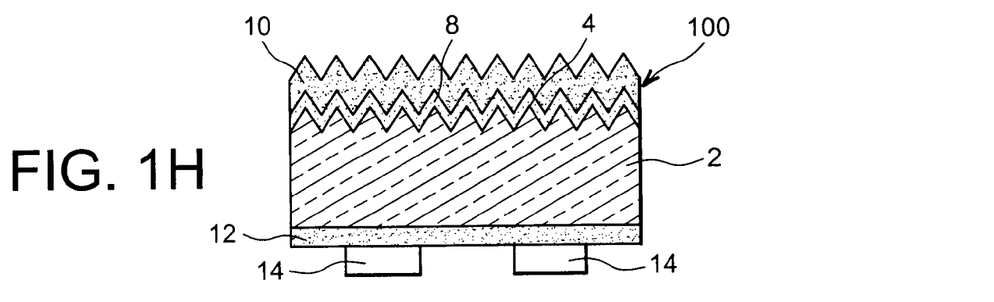
Figure 1I:
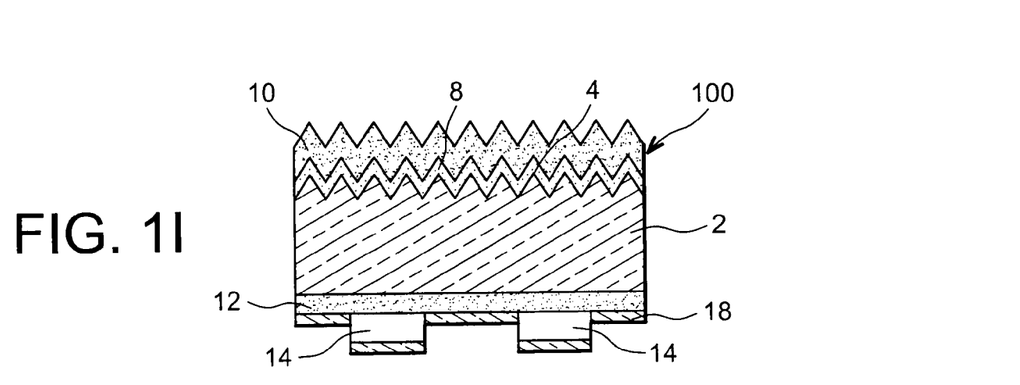
Figure 1J:
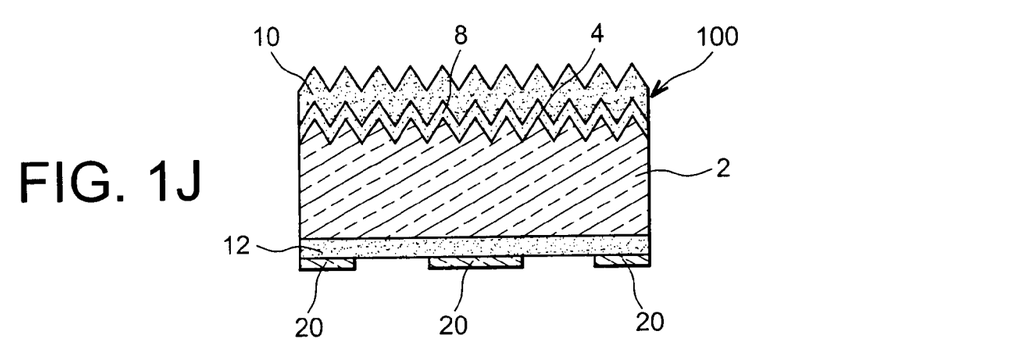
Figure 1K:
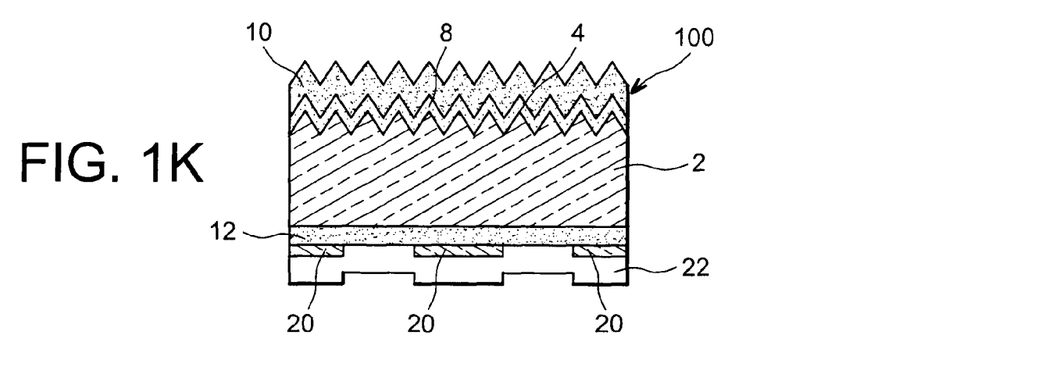
Figure 1L:
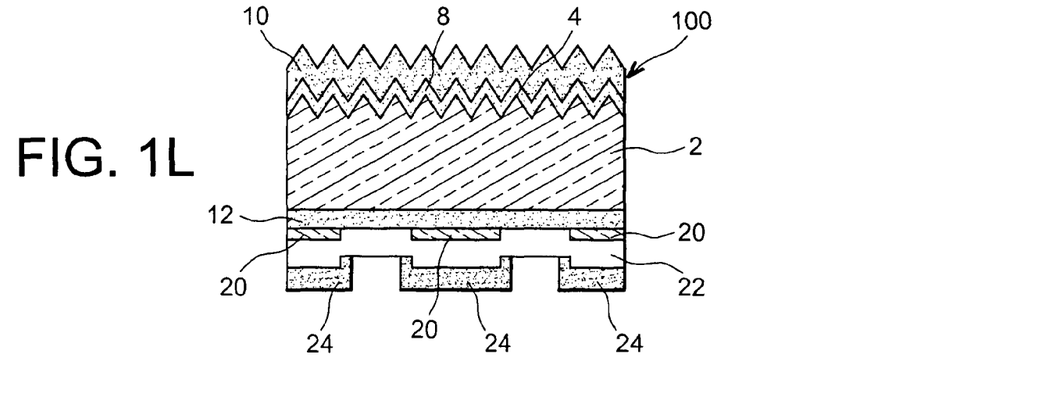
Figure 1M:
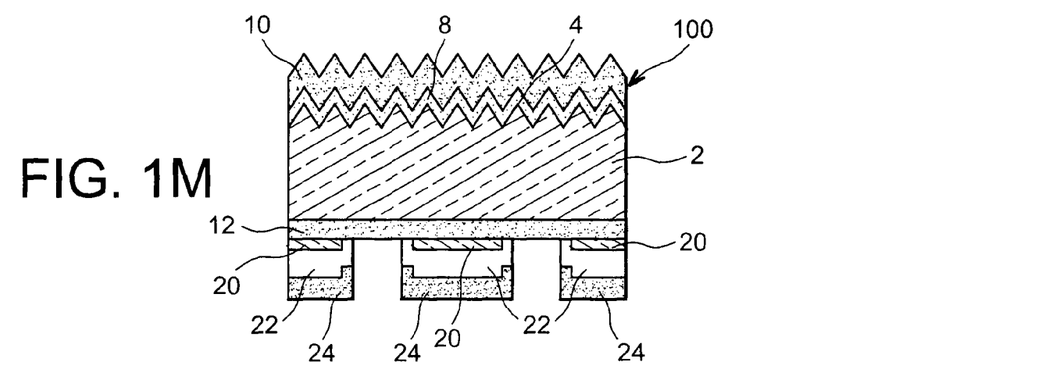
Figure 1N:
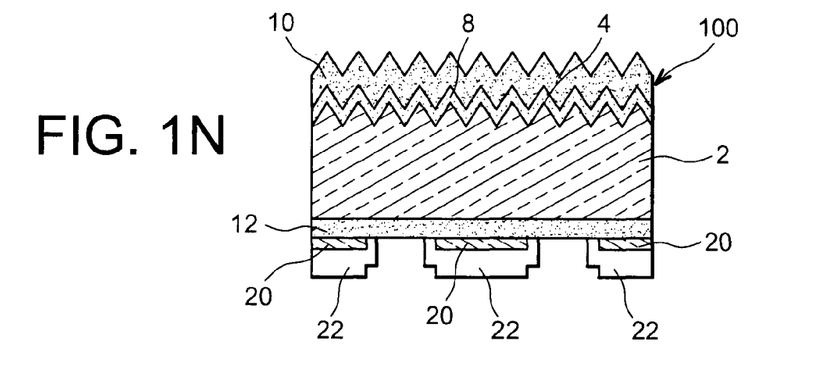
Figure 1O:
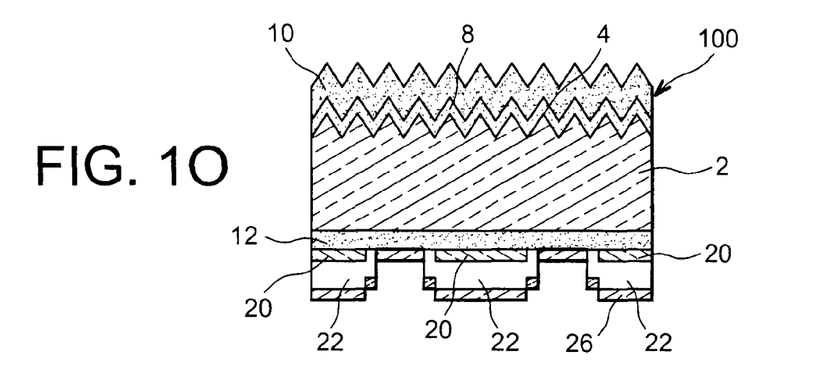
Figure 1P:
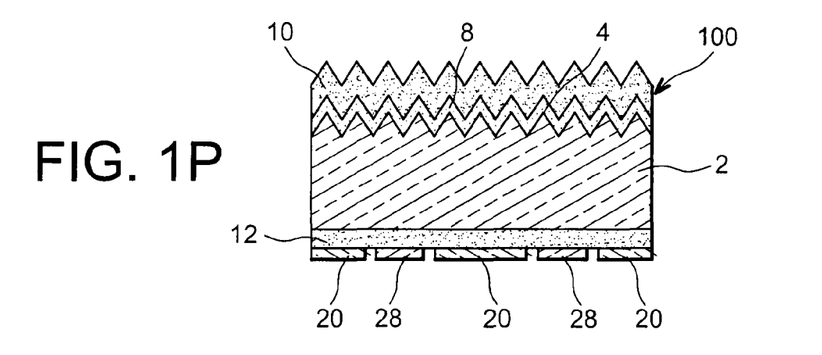
Figure 1Q:
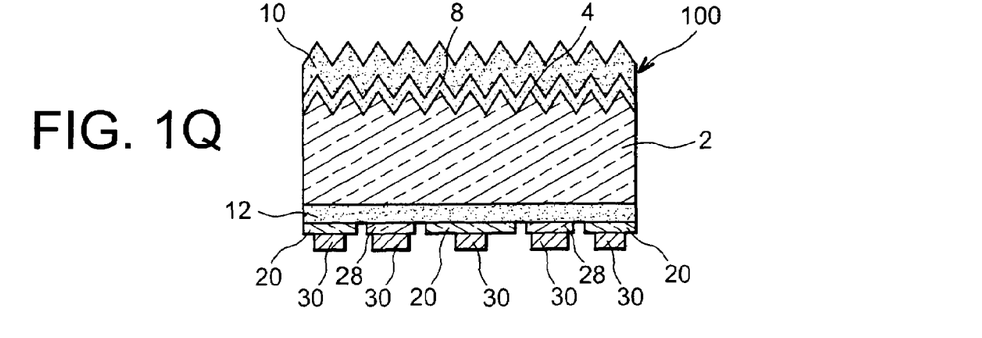
Figure 1R:
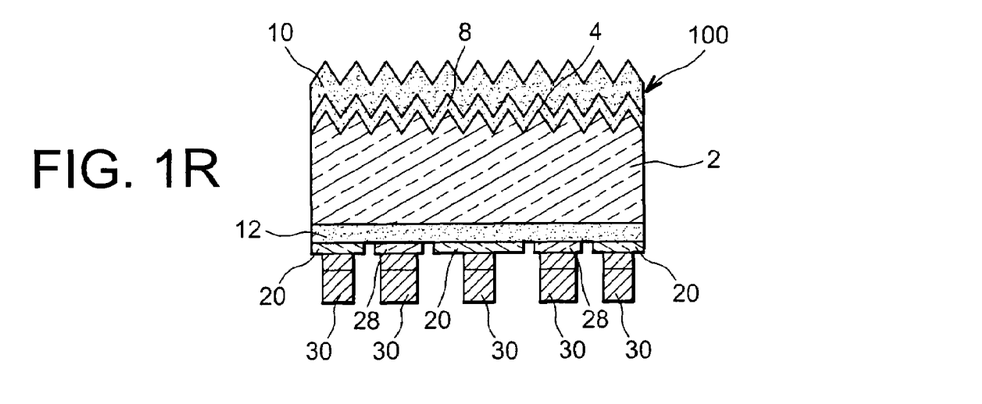

Reference is first made to FIGS. 1A to 1R, which show the steps of a method of producing a photovoltaic cell 100 according to a first embodiment.

Reference is made first to substrate 2 based on at least one semiconductor (FIG. 1A). This substrate 2 comprises a textured front surface 4 and a polished back surface 6. The substrate 2 may be based on a monocrystalline or polycrystalline silicon of type P or N.

As shown in FIG. 1B, a first layer 8, e.g., a thin layer having a thickness of between approximately 1 nm and 5 nm, of doped or intrinsic, hydrogenated amorphous silicon, is deposited onto the front surface 4 of the substrate 2. This layer 8 may likewise be based on doped or intrinsic, hydrogenated amorphous silicon carbide. The first layer 8 preferably comprises a large energy gap (greater than 1.8 eV or 2 eV) so as to limit absorption of the solar spectrum. This first layer 8 is deposited via PECVD (plasma-enhanced chemical vapour deposition) at a temperature, for example, of between approximately 200° C. and 400° C., this temperature being adapted according to the nature of the first layer 8. If the first layer 8 is doped with the opposite type of conductivity from the type of conductivity of the substrate 2, then, during operation of the photovoltaic cell 100, a front surface field forms at the level of the front surface 4 and the first layer 8, thereby making it possible to reduce recombination at this interface. It is likewise possible to form a floating junction if the first doped layer 8 is of the same type of conductivity as the substrate 2.

An anti-reflective layer 10, shown in FIG. 1C, e.g., based on silicon nitride, is deposited onto the first layer 8 via PECVD, at a temperature of between 150° C. and 400° C.

This layer 10, for example, may have a thickness of between approximately 60 nm and 80 nm.

A passivation layer 12 based on hydrogenated intrinsic amorphous silicon a-Si:H is deposited onto the back surface 6 of the substrate 2 via PECVD (FIG. 1D). The thickness of this passivation layer 12, for example, may be between approximately 1 nm and 50 nm.

A first sacrificial layer 14 is next deposited onto the passivation layer 12, as shown in FIG. 1E. This first sacrificial layer 14 is deposited via PECVD, at a temperature less than or equal to approximately 200° C. or 250° C., so as to not recrystallized the previously deposited amorphous silicon of layers 8 and 12, and to thereby minimize degradation of the layers 8 and 12 of amorphous silicon.

In order to carry out a low-temperature deposition such as this, a heating support intended to receive the substrate is first heated to a low temperature (less than or equal to approximately 200° C. or 250° C.). The deposition chamber used is next purged by means of an inert gas, e.g., helium, so as to eliminate the air and more generally the dioxygen present in the deposition chamber, which is likely to oxidize the substrate. The substrate is then deposited onto the pre-heated support. The plasma is then ignited with the $SiH_4$ gas alone or a mixture of $SiH_4$ and $N_2O$, at a high pressure (e.g., greater than approximately 333 Pa). $N_2O$ is then injected into the deposition chamber, thereby forming the sacrificial layer 14. This first sacrificial layer 14 may be based on silicon oxide, and/or silicon carbide, and/or silicon nitride. During deposition of the sacrificial layer 14, ion bombardment undergone by the amorphous semiconductor is minimized, for example, by increasing the working pressure (e.g., to greater than approximately 333 Pa).

A first etching mask 16 is deposited onto the first sacrificial layer 14 (FIG. 1F). This first etching mask 16 is produced screen-printing of an acid-resistant polymer-based paste capable of being dissolved by a solvent. The use of a pattern recognition system enables obtainment of an excellent degree of precision, e.g., between approximately 50 μm and 100 μm, in terms of screen-printing alignment.

As shown in FIG. 1G, the portions of the first sacrificial layer 14 not covered by the first etching mask 16 are etched upon contact with a hydrofluoric acid bath. Only the portions of the first sacrificial layer 14 situated beneath the patterns formed by the first etching mask 16 are still present. In this way, the pattern formed by the first etching mask 16 is transferred to the first sacrificial layer 14. The passivation layer 12 is not attacked by the acid. The first mask 16 is next removed with a solvent (FIG. 1H). A first sacrificial mask 14 is then obtained.

According to a first alternative, it is possible to replace the steps of depositing the first etching mask 16, of etching the portions of the first sacrificial layer 14 not covered by the first etching mask 16 and of removing the first etching mask 16, i.e., the three steps shown in FIGS. 1F to 1H, with a step of depositing a so-called "HF" paste via screen printing, in a reverse pattern of the pattern of the first etching mask 16, thereby directly etching the first sacrificial layer after localized heat activation (e.g., at between 130° C. and 150° C.), in order to form the first sacrificial mask 14. A rinsing step enables elimination of the etching residues and the HF paste. According to a second alternative, it is likewise possible to anticipate replacing the steps of depositing the first sacrificial layer 14, of depositing the first etching mask 16, of etching the portions of the first sacrificial layer 14 not covered by the first etching mask 16 and of removing the first etching mask 16 with a step of directly depositing a polymer or oxide paste, such as oxide glass, via screen printing, in a pattern identical to the pattern of the first sacrificial mask 14 shown in FIG. 1H. These alternatives make it possible to reduce the number of steps of the method of producing photovoltaic cells.

As shown in FIG. 1I, a doped amorphous silicon layer 18 of a first type of conductivity, N in this case, is deposited via PECVD, at a temperature equal to approximately 200° C., onto the first sacrificial mask 14 and onto the portions of the passivation layer 12 not covered by the first sacrificial mask 14. This layer 18, for example, has a thickness of between approximately 5 nm and 30 nm.

The first sacrificial mask 14 is etched with hydrofluoric acid, and the doped amorphous silicon of layer 18 situated on the first sacrificial mask 14 is removed, e.g., via the "lift-off" process (lifting off by elimination of the under-layer) (FIG. 1J). In this way, N-doped amorphous silicon pads 20 are formed on the intrinsic amorphous silicon layer 12.

A second sacrificial layer 22 (FIG. 1K) is deposited onto the amorphous silicon of layer 12 and onto the pads 20, via PECVD, e.g., at a temperature less than or equal to approximately 200° C., so as to not recrystallized the previously deposited amorphous silicon of layers 8 and 12 and pads 20. This second sacrificial layer 22, for example, may be based on silicon oxide, and/or silicon carbide and/or silicon nitride.

A second etching mask 24 is deposited onto the second sacrificial layer 22, at the level of the N-doped amorphous silicon pads 20 (FIG. 1L). This second etching mask 24 is deposited via screen printing of an acid-resistant polymer paste capable of being dissolved by a solvent. Here again, the use of a pattern recognition system makes it possible to obtain accuracies, e.g., of between approximately 50 μm and 100 μm, in terms of screen-printing alignment.

As shown in FIG. 1M, the portions of the second sacrificial layer 22 not covered by the second etching mask 24 are etched upon contact with a hydrofluoric acid bath. Only the portions of the second sacrificial layer 22 situated beneath the patterns formed by the second etching mask 24 are still present. In this way, the pattern formed by the second etching mask 24 is transferred to the second sacrificial layer 22, thereby producing a second sacrificial mask 22. The passivation layer 12 is not attacked by the acid. The second etching mask 24 is next removed with a solvent (FIG. 1N).

In a way similar to the first alternative explained above, it is possible to replace the steps of depositing the second etching mask 24, of etching the portions of the second sacrificial layer 22 not covered by the second etching mask 24 and of removing the second etching mask 24, i.e., the three steps shown in FIGS. 1L to 1N, with a step of depositing a so-called "HF" paste via screen printing, in a reverse pattern of the pattern of the second etching mask 24, thereby directly etching the second sacrificial layer locally, in order to form the second sacrificial mask 22. A rinsing step enables elimination of the etching residues and the HF paste. According to the second alternative, the steps of depositing the second sacrificial layer 22, of depositing the second etching mask 24, of etching the portions of the second sacrificial layer 22 not covered by the second etching mask 24 and of removing the second etching mask 24, may be replaced with a step of directly depositing a polymer or oxide paste, such as oxide glass, via screen printing, in a pattern identical to the pattern of the second sacrificial mask 22 shown in FIG. 1N.

As shown in FIG. 1O, a doped amorphous silicon layer 26 of a second type of conductivity, in this case P, is deposited via PECVD, at a temperature equal to approximately 200° C., onto the second sacrificial mask 22 and onto the portions of the passivation layer 12 not covered by the second sacrificial mask 22. This layer 26, for example, has a thickness of between approximately 5 nm and 30 nm.

The second sacrificial mask 22 is etched with hydrofluoric acid and the doped amorphous silicon of layer 26 situated on the second sacrificial mask 22 is removed via the "lift-off" process (FIG. 1P). In this way, P-doped amorphous silicon pads 28 are formed on the intrinsic amorphous silicon layer 12. A heterojunction is thereby obtained, which is formed on the back surface of the photovoltaic cell 100, by the N and P amorphous silicon pads 20, 28 and the crystalline silicon-based substrate 2.

Next, the metallizations of the solar cell 100 are next produced. To accomplish this, a metal 30, e.g., based on aluminium, and/or copper and/or silver, is selectively deposited, e.g., via evaporation, through a mask the pattern of which is substantially similar to the pattern formed by the N- and P-doped amorphous silicon pads 20 and 28, or in such a way that the metallizations deposited are arranged on the pads and 28 (FIG. 1Q). The surface area of the deposited metallizations is preferably as large as possible, so as to improve optical confinement when a thin silicon substrate is used (having a thickness less than approximately 200 μm). The thickness of the contacts 30 may be increased to a thickness of approximately 20 μm, for example, by autocatalytic plating or by electroplating (FIG. 1R). Metallizations are then obtained which enable excellent current conduction, thereby limiting resistance losses.

FIGS. 2A to 2I are partial representations of the steps of producing a photovoltaic cell 200 according to a second embodiment.

First of all, steps are carried out which are similar to those described previously in the first embodiment corresponding to FIGS. 1A to 1I. Therefore, there is a substrate 2 comprising, on the front surface, the first layer 8 and the anti-reflective layer 10, and, on the back surface, the passivation layer 12 onto which the pads of the first sacrificial mask 14 covered with the N-doped amorphous silicon layer 18 are deposited.

Figure 2A:
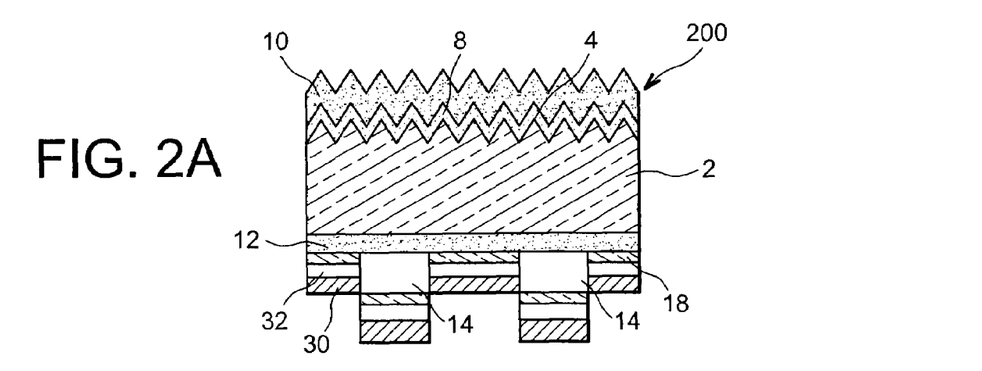
FIGS. 2A to 2I show the steps of a method of producing a photovoltaic cell, according to a second embodiment of the invention.
Figure 2B:
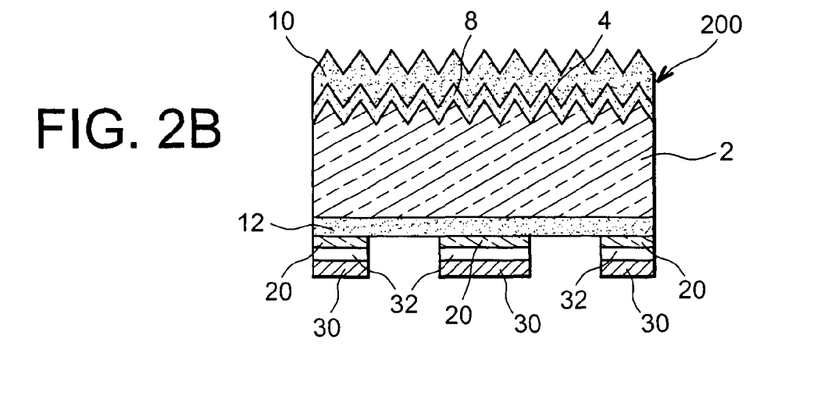
Figure 2C:
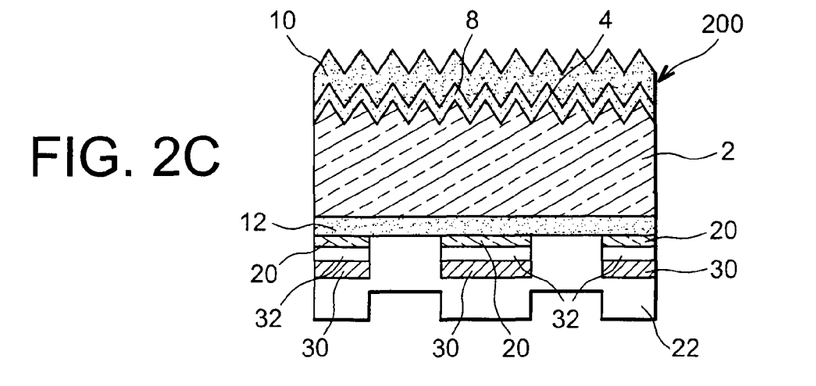
Figure 2D:
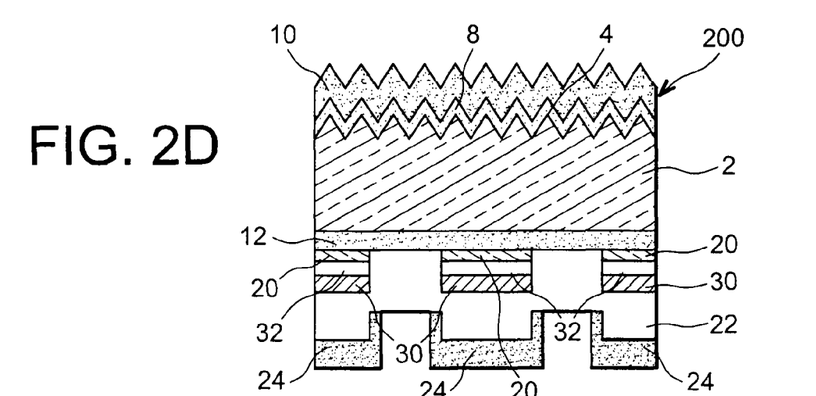
Figure 2E:
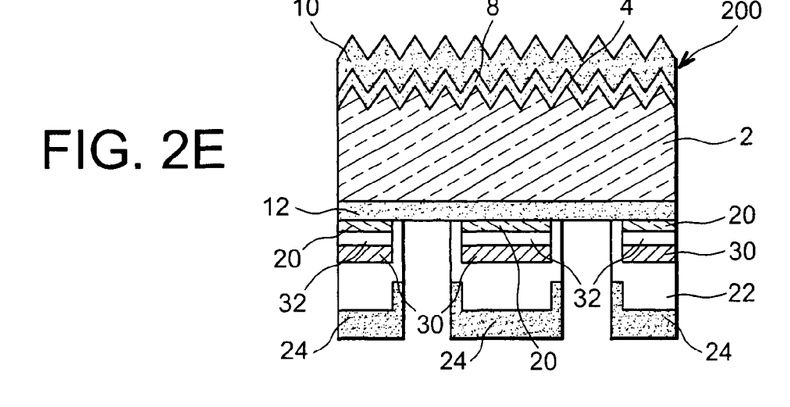
Figure 2F:
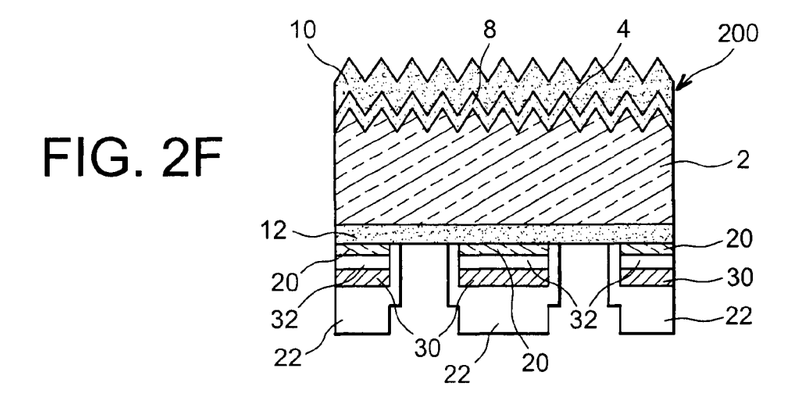
Figure 2G:
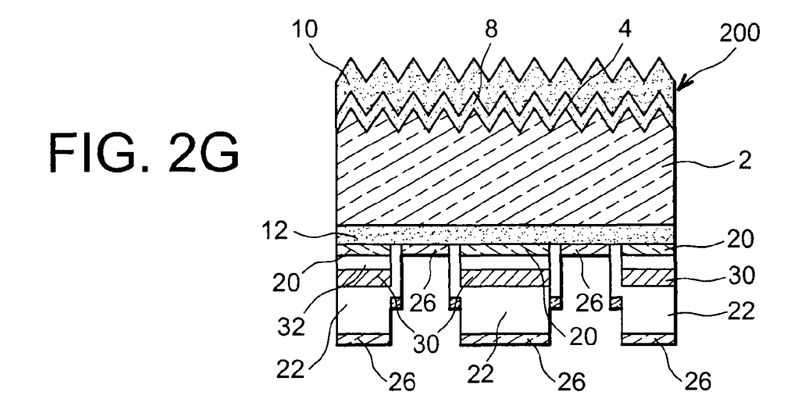

As shown in FIG. 2A, a conductive transparent oxide layer (ITO) 32 and metallizations 30 are then deposited, e.g., by spraying. Then, the first sacrificial mask 14 is etched, thus forming pads 20 of N-doped amorphous silicon covered with the layer of ITO 32 and the metallizations 30 (FIG. 2B). The oxide 32 and the metallizations 30 situated on the first sacrificial mask 14 are removed during the step of etching the first sacrificial mask 14.

Figure 2H:
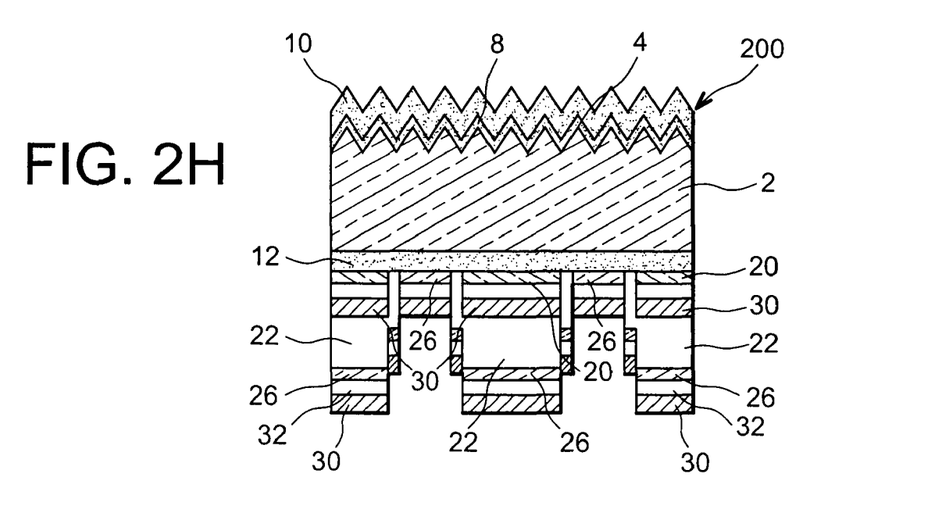
Figure 2I:
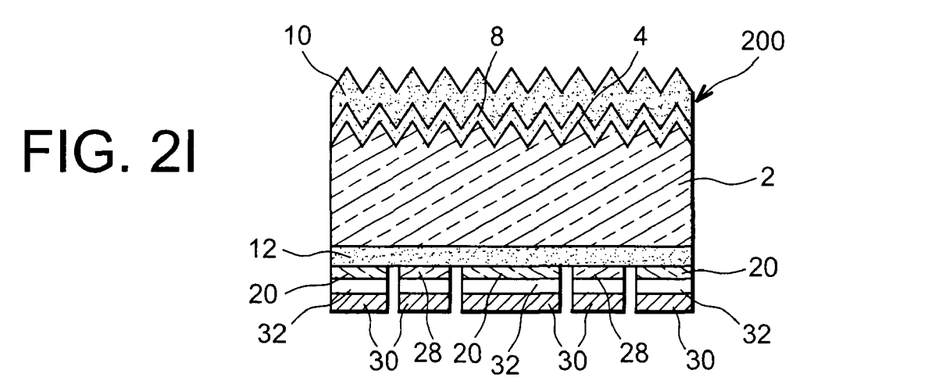

The P-doped amorphous silicon pads 28 are made in a way similar to the first embodiment, and as shown in FIGS. 2C to 2I. Prior to the step of removing the second sacrificial mask 22, a conductive transparent oxide layer (ITO) 32 and metallizations 30 are deposited (FIG. 2H). The oxide 32 and the metallizations 30 deposited onto the second sacrificial mask 22 are removed during the step of etching the second sacrificial mask 22, the oxide 32 and the metallizations 30 remaining only on the P-doped amorphous silicon pads 28.

The first and second alternatives described previously for the first embodiment can likewise be applied to this second embodiment.

The invention claimed is:
1. A method of producing a photovoltaic cell, comprising:
 a) depositing a passivation layer based on at least one intrinsic amorphous semiconductor on a back surface of a substrate based on at least one crystalline semiconductor;
 b) screen-printing a first sacrificial mask comprising at least one through-opening on the passivation layer;
 c) depositing a doped amorphous semiconductor layer of a first type of conductivity at least in the opening; and
 d) removing the first sacrificial mask, leaving at least one doped amorphous semiconductor pad of the first type of conductivity remaining at the opening of the first sacrificial mask;
 operations a)-d) being carried out at temperatures less than or equal to approximately 250° C.

2. A method according to claim 1, wherein the operations a), b), c) and d) are carried out at temperatures less than or equal to approximately 200° C.

3. A method according to claim 1, further comprising, prior to the a) depositing the passivation layer, depositing a layer based on at least one amorphous semiconductor onto a front surface of the substrate, which is opposite the back surface of the substrate.

4. A method according to claim 3, further comprising, after the depositing the amorphous semiconductor-based layer onto the front surface of the substrate, depositing an anti-reflective layer onto the amorphous semiconductor-based layer.

5. A method according to claim 1, the b) screen-printing a first sacrificial mask comprising:
 depositing a first sacrificial layer based on silicon oxide, and/or silicon carbide, and/or silicon nitride onto the passivation layer;
 depositing via screen printing a first etching mask in a pattern similar to the pattern of the first sacrificial mask;
 removing via etching the portions of the first sacrificial layer not covered by the first etching mask, the remaining portions of the first sacrificial layer thus forming the first sacrificial mask; and
 removing the first etching mask.

6. A method according to claim 1, the b) screen-printing the first sacrificial mask comprising:
 depositing a first sacrificial layer based on silicon oxide, and/or silicon carbide, and/or silicon nitride onto the passivation layer;
 depositing via screen printing an etching paste, in a reverse pattern of the pattern of the first sacrificial mask, thereby forming the first sacrificial mask in the first sacrificial layer.

7. A method according to claim 1, the b) screen-printing the first sacrificial mask comprising depositing via screen printing a paste based on a polymer and/or an oxide, thereby forming the first sacrificial mask.

8. A method according to claim 1, further comprising, after the d) removing:
 e) screen-printing a second sacrificial mask, the second sacrificial mask overlapping at least the doped amorphous semiconductor of the first type of conductivity;
 f) depositing a doped amorphous semiconductor layer of a second type of conductivity, which is opposite the first type of conductivity, into at least one pattern formed by the second sacrificial mask; and
 g) removing the second sacrificial mask, leaving at least one doped amorphous semiconductor pad of the second type of conductivity remaining at the level of the second sacrificial mask pattern.

9. A method according to claim 8, the e) screen-printing the second sacrificial mask comprising:
 depositing a second sacrificial layer based on silicon oxide, and/or silicon carbide, and/or silicon nitride onto the passivation layer;
 depositing via screen printing a second etching mask in a pattern similar to the pattern of the second sacrificial mask;
 removing via etching the portions of the second sacrificial layer not covered by the second etching mask, the remaining portions of the second sacrificial layer thus forming the second sacrificial mask; and removing the second etching mask.

10. A method according to claim 8, the e) screen-printing the second sacrificial mask comprising:

depositing a second sacrificial layer based on silicon oxide, and/or silicon carbide, and/or silicon nitride onto the passivation layer;

depositing via screen printing an etching paste, in a reverse pattern of the pattern of the second sacrificial mask, thereby forming the second sacrificial mask in the second sacrificial layer.

11. A method according to claim 8, the e) screen-printing producing the second sacrificial mask comprising depositing, via screen printing, a polymer and/or oxide paste, thus forming the second sacrificial mask.

12. A method according to claim 8, further comprising, prior to the g) removing the second sacrificial mask, depositing metallizations.

13. A method according to claim 8, further comprising, after the g) removing the second sacrificial mask, depositing metallizations onto the doped amorphous semiconductor of the first type of conductivity and onto the doped amorphous semiconductor of the second type of conductivity via evaporation and/or spraying through a metallic mask.

14. A method according to claim 1, further comprising, prior to the d) removing the first sacrificial mask, depositing metallizations.

15. A method according to claim 12, further comprising, prior to the depositing metallizations, spray-depositing a conductive transparent oxide onto the doped amorphous semiconductor, the metallizations next being deposited onto the conductive transparent oxide.

* * * * *